United States Patent [19]

Yau et al.

[11] Patent Number: 4,587,138
[45] Date of Patent: May 6, 1986

[54] MOS REAR END PROCESSING

[75] Inventors: Leopoldo D. Yau, Durham; Robert A. Gasser, Jr., Cornelius; Kenneth R. Week, Jr., Sherwood; Jick M. Yu, Beaverton; David D. Chin, Aloha, all of Oreg.

[73] Assignee: Intel Corporation, Santa Clara, Calif.

[21] Appl. No.: 670,161

[22] Filed: Nov. 9, 1984

[51] Int. Cl.$^4$ .......................... B05D 5/12; G03C 7/26
[52] U.S. Cl. ........................................ 427/88; 427/90; 427/93; 430/271
[58] Field of Search ............... 427/90, 93; 430/271, 430/319

[56] References Cited

U.S. PATENT DOCUMENTS

| 4,102,683 | 7/1978 | DiPiazza | 430/319 |
| 4,305,974 | 12/1981 | Abe et al. | 427/93 |
| 4,357,416 | 11/1982 | Fan | 430/271 |
| 4,476,156 | 10/1984 | Brinker et al. | 427/93 |

OTHER PUBLICATIONS

Lin et al, "IEDM International Electron Device Meeting, IEEE", 1982, Dec. 1982, pp. 399–402.

Primary Examiner—John H. Newsome
Attorney, Agent, or Firm—Blakely, Sokoloff, Taylor & Zafman

[57] ABSTRACT

A process for the reduction of defect formation in conductive layers of semiconductor bodies during patterning, alloying and passivation. A film of low temperature spin-on-glass containing dye is formed on the conductive layer prior to patterning and any high temperature process greater than 200 degrees C. Hermetic passivation is achieved by depositing on the conductive layer a composite film consisting of a lower, tensile layer and an upper, compressive layer with the net force of the passivation film being tensile.

7 Claims, 11 Drawing Figures

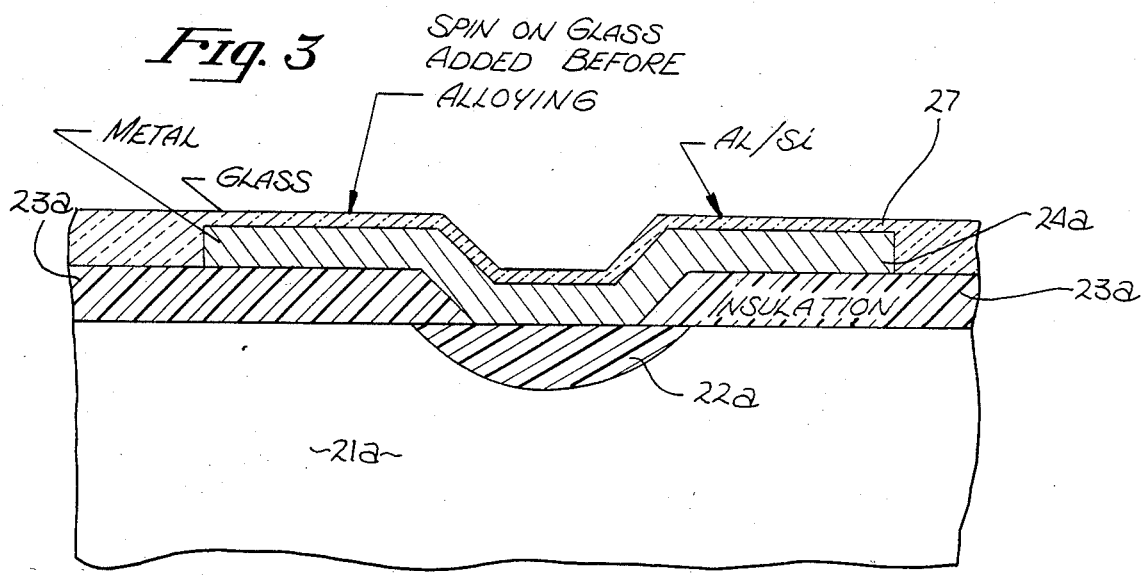
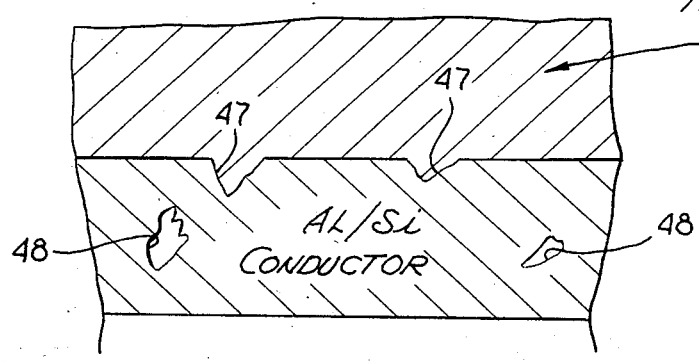

Fig. 5 (PRIOR ART)
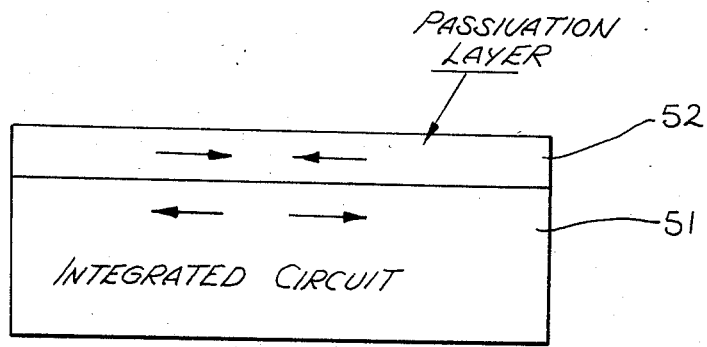
$a_{52} < a_{51}$
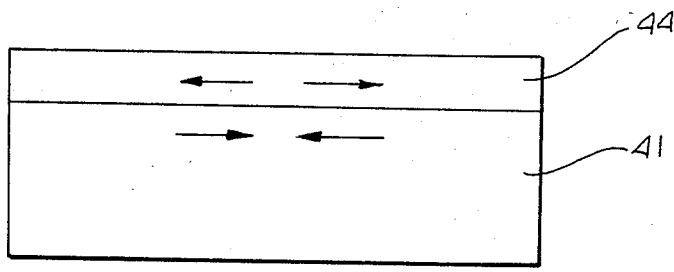
$a_{44} > a_{41}$
Fig. 6
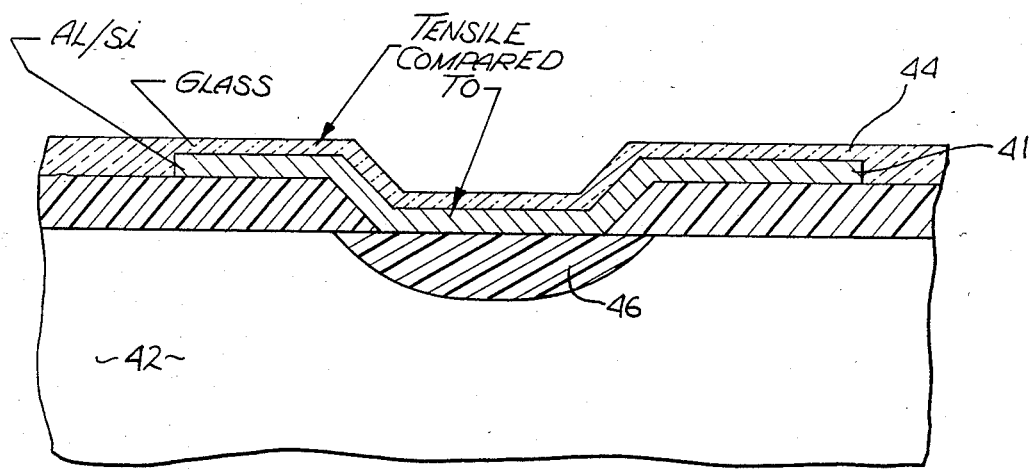
Fig. 7

MOS REAR END PROCESSING

BACKGROUND OF THE INVENTION

1. Field of the Invention

This invention relates to improved methods for forming an alloyed conductive layer on a semiconductor body and improved methods for hermetic passivation of the conductive layer.

2. Prior Art

In the manufacture of semiconductor devices, it is generally necessary to interconnect two parts of an integrated circuit by means of a conductive layer. Often this is done by first depositing a metal layer of aluminum/silicon alloy into a "contact window", (i.e., an aperture made in the insulating layers of the semiconductors devices). Next, the metal layer is patterned by methods standard in the integrated circuit industry. Subsequently, the patterned circuit is heated or alloyed to improve the contact resistance of the metal to the silicon substrate.

One problem associated with patterning of the conductive layer is undercutting caused when light reflects off the conductive layer. Prior art attempts to solve this problem have included the use of a layer of polyimide as an anti-reflective coating (ARC). The disadvantages of this process is that it has a narrow process window and a more complicated procedure during reworking.

A second problem, associated with alloying, is that hillocks form on the surface of the resulting metal layer and voids form within the layer. The surface hillocks make subsequent masking of the layer difficult while the voids adversely affect the conductive properties of the layer.

One attempt to solve this problem uses TiWN coatings on the metal layer to suppress hillock formation. See "Reduction of Hillock Formation in Aluminum Thin Films" *Semiconductor International*, April 1982. Another method deposits a layer of $SiO_2$ glass, see "Hillock Growth on Vacuum Deposited Aluminum Films" *The Journal of Vacuum Science and Technology* Vol. 9, No. 1. With this method it is difficult to maintain the integrity of upper level glass and metal layers. In "Surface Reconstruction of Aluminum Metallization—A new Potential Wearout Mechanism" E. Philofsky et. al., it was noted that glassing and adding alloy additives to aluminum retarded low temperature surface reconstruction of metal films (p. 122) and that problems of high current density or shorting due to surface reconstruction could be reduced or eliminated by glassing over or alloying with another element in aluminum (p. 123). The above processes have not proven satisfactory in preventing hillocks or voids.

After the conductive layer has been alloyed and patterned, it is generally sealed by hermetic passivation. Plastic packaging calls for a hermetic passivation such as plasma silicon nitride. In the prior art, a compressive film (films applying a tensile stress on the underlying conductive layer) is used to keep the surface hermetic. One resulting problem is cracking and voiding in the conductive layer. During cooling of the semiconductor device after passivation, the conductive layer contracts more rapidly than the sealing layer. That layer is, in effect, holding onto the conductive layer while the conductive layer shrinks during cooling. This puts large stresses on the conductive layer, stress of sufficient magnitude to cause cracking and metal grain migration on the surface of the conductive layer. As a result, current densities in the conductive layer reach levels beyond their design limits. A typical upper level of current density in certain devices is $5 \times 10^4$ amps/cm$^2$. However, due to the reduction of the cross sectional area, levels can increase tenfold in damaged conductive layers, to as high as $5 \times 10^5$ amps/cm$^2$, leading to unreliable performance or failure.

The present invention is directed toward reducing defects in the conductive layer in semiconductor devices.

SUMMARY OF THE INVENTION

The invented process is applicable in the fabrication of semiconductor devices to limit defect formation in the conductive layer of such devices during three processing steps, patterning, alloying and passivation. A film of low temperature, spin-on-glass containing dye is deposited on the aluminum/silicon metallization before patterning or heating above 200 degrees C. The entire device is then heated at a temperature sufficient to sinter the aluminum/silicon metal layer to the silicon substrate. The glass film inhibits undercutting during patterning and inhibits the formation of hillocks and voids on the surface of the alloyed conductive layer. Subsequent hermetic passivation is achieved without cracking in the conductive layer by forming a composite layer of glass on a conductive layer, with the lower glass layer having a tensile stress and the upper layer having a compressive stress. The thicknesses of the composite layers are chosen to provide a net tensile stress. The glass film results in hermetic passivation without cracking or metal grain migration in the conductive layer.

BRIEF DESCRIPTION OF THE DRAWINGS

FIG. 3 illustrates the semiconductor body of FIG. 1 after a spin-on-glass layer has been formed thereon.

FIG. 4 is an expanded cross-sectional elevation view of the defects formed in a conductive layer after prior art passivation.

FIG. 5 illustrates an example of a prior art compressive film formed on an underlying body, causing the underlying body to be in tension.

FIG. 6 illustrates an example of a tensile film formed on an underlying body, causing the underlying body to be in compression.

FIG. 7 is a cross-sectional elevation view of a semiconductor body with a composite film deposited thereon.

DETAILED DESCRIPTION OF THE INVENTION

An invention is described which inhibits defect formation in the conductive layer of semiconductor bodies during the processing steps of patterning, alloying and passivation. In the following description, numerous specific details are set forth such as specific thicknesses, etc., in order to provide a thorough understanding of the present invention. It will be obvious, however, to one skilled in the art that the present invention may be practiced without these specific details. In other instances, well-known processes have not been described in detail in order not to unnecessarily obscure the present invention.

PRIOR ART, METALLIZATION PROCESS

Figure 1:
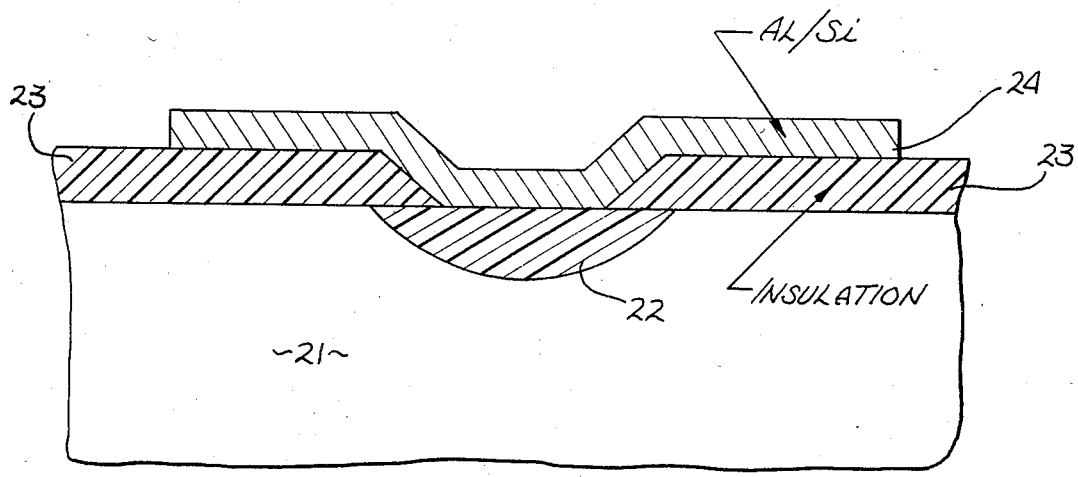
FIG. 1 is a cross-sectional elevation view of a prior art semiconductor body with two layers thereon used to describe the prior art.
Figure 2:
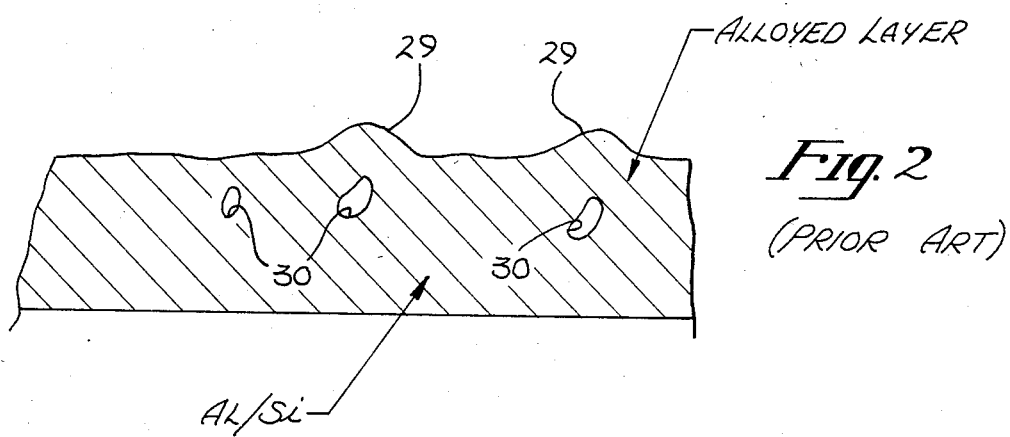
FIG. 2 is an expanded view of the formed layers of FIG. 1 after sintering has taken place.

FIGS. 1 and 2 illustrate prior art processing of an alloyed conductive layer on a semiconductor body. The semiconductor body comprises a monocrystalline silicon substrate 21, an insulating layer 23 and a doped region 22. An aperture or "contact window" is formed over the doped region 22 to allow contact with a conductive layer. In the prior art a metal layer 24 such as aluminum or aluminum/silicon alloy is formed on the insulating layer 23 and doped region 22. Sufficient heat is now applied to sinter and improve the ohmic contact to the silicon substrate.

The problem associated with the prior art processing results from stresses placed on the conductive layer during high temperature cycles. The surface of the alloyed conductive layer is marred by hillocks 29 and voids 30 of FIG. 2 formed during the alloying process. These hillocks 29 make subsequent masking difficult while the voids 30 adversely affect conducting properties of the metal.

PRESENT INVENTION, METALLIZATION PROCESS

In the present invention, the process begins in a manner similar to the prior art. Namely, an aluminum or aluminum/silicon layers 24a is formed in the contact window of a substrate as shown in FIG. 3 for the semiconductor body 21a. (The letter "a" has been added to numbers of FIG. 1 in FIG. 3 to designate like elements.) After the conductive layer has been formed and prior to patterning or any high temperature process a layer of low temperature spin-on-glass 27 of FIG. 3 is formed on the aluminum layer 24a. The spin-on-glass contains dye so it can act as an anti-reflective coating during patterning. There are many brands and compositions of low temperature spin-on-glass currently available on the market. All types of spin-on-glass composition including doped and undoped silicon films were found to be effective in hillock and void suppression in metal layers. It is important that the layer of spin-on-glass 27 be formed before patterning or any high temperature cycle greater than 200 degrees C. in order to prevent the formation of hillocks on the surface of the alloyed conductive layer. After formation of the glass layer 27, the entire body can be heated at a temperature sufficient to sinter the aluminum/silicon alloy 24a of FIG. 3. In the preferred embodiment of the present invention, the spin-on-glass layer 27 is approximately 800–5000 A thick. Tests have shown that thicker films more effectively reduce the formation of hillocks.

The precise reason or reasons why the spin-on-glass prevents formation of hillocks is not understood. It is believed, however, that the force of the layer on the metal layer during alloying may prevent the hillock formation. In prior art processing the force of other layers did not provide the same result since these layers were added after alloying or after some high temperature cycle greater than 200 degrees C. occurred. This is not the case with the low temperature spin-on-glass.

The use of spin-on-glass to achieve the above results is preferred to prior art mechanisms of $SiO_2$ glass, plasma glassing or CVD glassing. The application of spin-on-glass not only suppresses the formation of hillocks, it also prevents crack formation at subsequent higher temperature processing. In the currently preferred embodiment, arsenic, titanium, phosphorus, boron, doped or undoped spin-on-glass were found to work effectively.

PRESENT INVENTION, PATTERNING

During patterning of the conductive layer, the layer of spin-on-glass acts as an anti-reflective coating. This prevents patterning defects, such as notching, that can occur when light reflects off the conductive layer and into an adjoining photoresist layer. An appropriate dye or combination of dyes are mixed with the spin-on-glass in sufficient quantity to reduce the relative reflections from the conductive layer to less than 20% when a layer of spin-on-glass is applied. In one embodiment, a dye such as basic yellow #11 is mixed with the spin-on-glass in an amount approximately 1% by weight of the dye. In addition to protecting against patterning defects (notching) the layer of spin-on-glass allows for a larger process window and at the same time ease of reworking. The etch selectively of the spin-on-glass is different than that of the photoresist, whereas the prior art polyimide ARC was similar to that of photoresist, resulting in a narrow process window.

Figure 11:
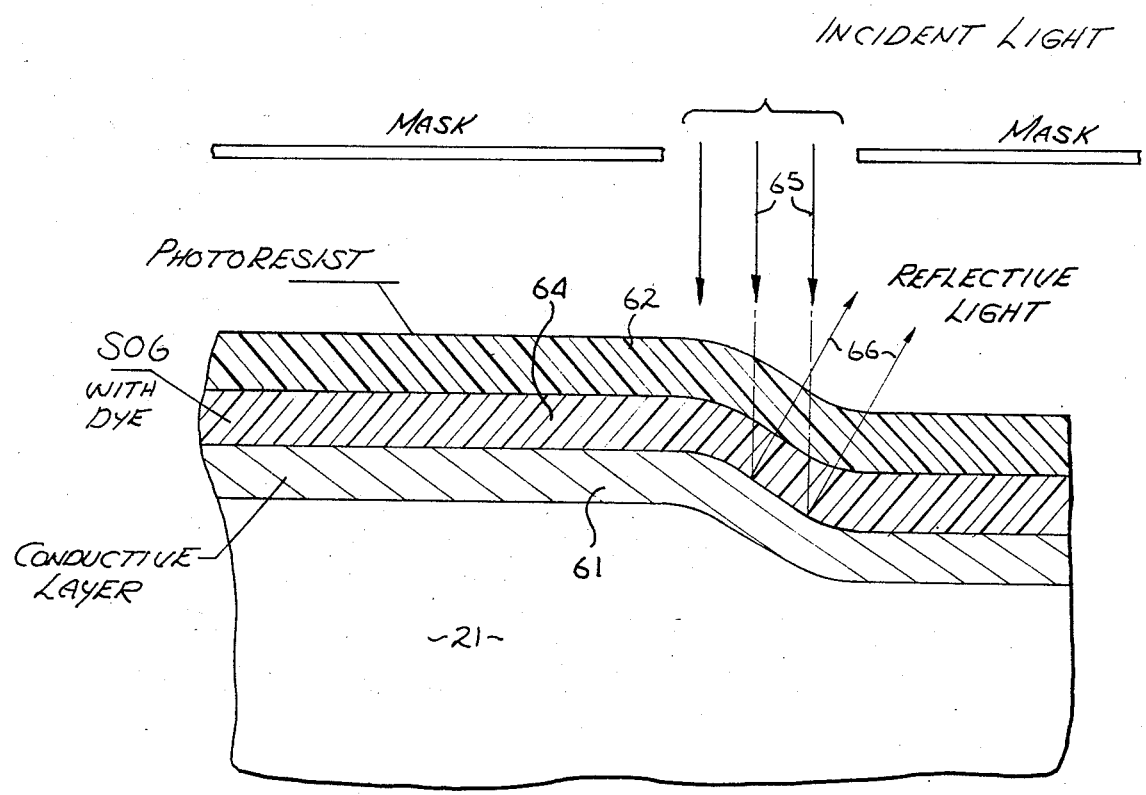
FIG. 11 illustrates a cross-sectional elevation view of a semiconductor body with an anti-reflective coating of spin-on-glass formed thereon.

FIG. 11 illustrates the use of the spin-on-glass as an ARC. A conductive layer 61 has been formed on a substrate 21. A layer of spin-on-glass 64 containing dye is then formed on the conductive layer 61. A photoresist layer is formed on the layer of spin-on-glass 64. The spin-on-glass 64 acts as an anti-reflective coating, preventing the incident light 65 from reflecting off the conductive layer at an angle 66 and thereby undercutting the adjacent photoresist pattern which is not supposed to be exposed. The thickness of the spin-on-glass layer could be in the range of 800 to 5000 A. After exposure of the resist, it is developed in a conventional manner. After the unwanted resist is developed away, the exposed SDG can be etched away anisotropically by Plasma or Reactive Ion Etching (RIE) so that the resist pattern is replicated on the SDG. Thereafter, the exposed metal (Al-Si) is etched anisotropically by Plasma or RIE. After the metal is etched the resist may be removed in conventional manner. The spin-on-glass layer is not removed from the remaining metal layer so that protection against hillocks and cracking is provided during subsequent heating cycles.

One advantage of the SDG ARC over the polyimide ARC is that in the event the resist process has to be reworked, only the resist need be stripped. This can be done using commercial stripper such as RT2. Due to good etch or strip selectivity between resist and the SDG, the SDG ARC can remain on the metal during the resist stripping and recoating process. In the case of the Polyimide ARC, the polyimide will also come off during the resist removal.

PRIOR ART, HERMETIC PASSIVATION

Most integrated circuits require hermetic passivation prior to packaging. Often in the prior art a "compressive film" is formed over the conductive layer such as a compressive nitride glass or other relatively thick insulative layer. An example of a compressive film is shown in FIG. 5. The stresses built up at the interface between the two materials result in the surface of the body 51 being put in tension while the film 52 is in compression as shown by the arrows. (Compressive film is typically employed in packaging because it resists the formation of cracks, thereby providing a better seal.) The tensile stress placed on the underlying body tends to foster cracks, particularly in underlying metal conductors.

The tension in the aluminum/silicon conductor causes the cracks 47 and voids 48 of FIG. 4 to form. The voids 48 are formed when aluminum migrates from the conductive layer. The reduction in the current carrying area of the conductive layer results in current densities exceeding the design limit of the devices. A typical density in some devices might be $5 \times 10^4$ amps/cm$^2$. Current densities in defective conductive layers can reach as high as $5 \times 10^5$ amps/cm$^2$, leading to device failure.

PRESENT INVENTION, HERMETIC PASSIVATION

Figure 8:
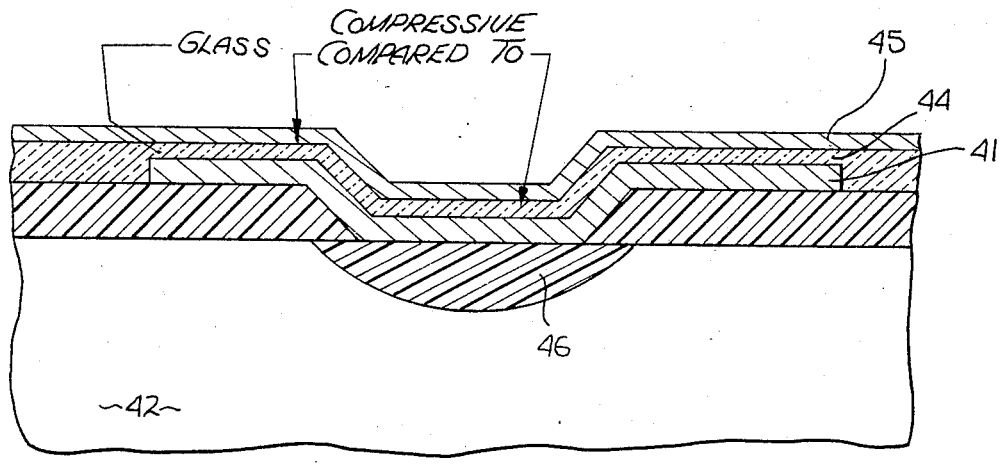
FIG. 8 illustrates the composite layer of FIG. 7 after further processing.

With the present invention, a tensile layer when compared to the conductive layer is first placed over the semiconductor body including the conductors. This is shown in FIG. 7 (without the optional SDG discussed in the prior section) for the semiconductor body 42. Once again, an opening is shown through an insulative layer to permit the conductive layer 41 to contact the doped region 46. The first glass layer 44 is a tensile layer compared to the silicon substrate. A tensile layer 44 is shown in FIG. 6. The layer 44 is in tension, placing the substrate 41 in compression, retarding defect formation. In the presently preferred processing, the layer 44 is pyrox, although other materials may be used. A typical thickness of this layer is approximately 2 microns. Following the formation of the layer 44, another glass layer 45 is formed over layer 44 as shown in FIG. 8. This layer is compressive in nature, and hence, provides the preferred hermetic sealing. In the preferred embodiment, layer 45 is an oxynitride layer approximately 1 micron thick. The tensile force of the underlayer 44 is greater than the compressive force of the layer 45 to assure that the resultant film has a net tensile effect, thereby reducing the cracking and voids of the metal layer 41. The thinner oxynitride layer is formed on the surface of the pyrox, greatly improving the adhesion of this compressive layer.

Figure 9:
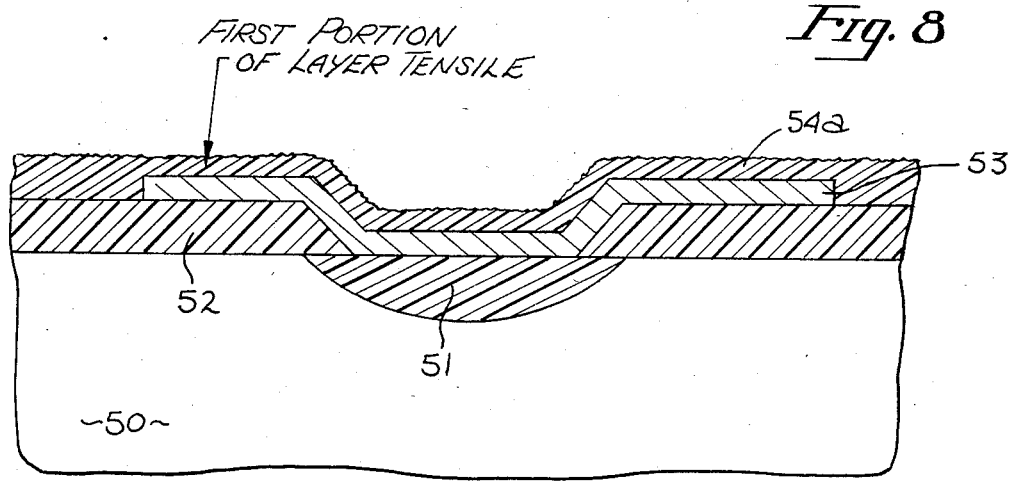
FIG. 9 is a cross-sectional elevation view of a semiconductor body with a tensile layer deposited thereon.
Figure 10:
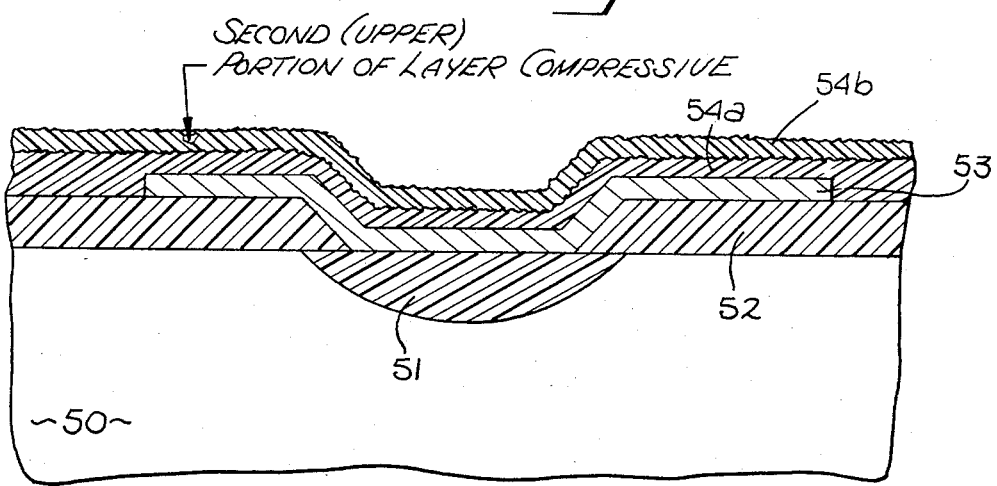
FIG. 10 illustrates the semiconductor body of FIG. 9 after a compressive layer has been deposited thereon.

In another embodiment, shown in FIGS. 9 and 10, a single composite film which has a lower portion with the tensile characteristics and the upper portion having the compressive characteristics is used. In FIG. 8, again a semiconductor body 50 is shown with an opening formed through the insulative layer 52 to a doped region 51. A conductive layer 53 such as aluminum/silicon contacts the doped region 51. A first portion of an oxynitride layer 54a is shown in FIG. 8. This layer is continually formed to form the upper portion 54b shown in FIG. 10, the upper portion providing the hermetically sealing compressive layer.

The composite film or layer 54 in the presently preferred embodiment, comprises oxynitride and is grown continuously without interruption at a constant temperature. The N$_2$O and pressure are varied to change the structural characteristics of the oxynitride. The following table describes an illustrative example for the formation of the layer for the tensile portion and compressive portion. Note that after 70 minutes of forming the tensile film, the N$_2$O flow and pressure are reduced for 35 minutes to form the upper portion or compressive portion of the layer.

|  | TENSILE LAYER | COMPRESSIVE LAYER |
| --- | --- | --- |
| TEMP DEGREE (C.) | 365 | 365 |
| SiH$_4$ (Sccm) | 146 | 146 |
| NH$_3$ (Sccm) | 1000 | 1000 |
| N$_2$O (Sccm) | 600 | 350 |
| R.F. (W) | 145 | 145 |
| PRESSURE (TORR) | 2.0 | 1.5 |
| TIME (Minutes) | 70 | 35 |

Sccm represents standard cubic centimeters per minute.

The above composite film could be formed with both layers having a refractive index equal to or less than 1.7, thus raising the transparency of the film to ultraviolet wavelengths. Such a film would permit the ultraviolet erasure of EPROMs.

In both the above described embodiments, the net passivation stress or force is tensile. When cooling the semiconductor body, the cracking described above and the formation of the voids described above, are prevented.

Thus, improved processing has been described which prevents undercutting and hillock formation and which provides an improved passivation layer.

We claim:

1. A process for forming a patterned, alloyed conductive layer on a semiconductor body comprising the steps of:
   a. depositing a metallic conductive layer over said semiconductor body;
   b. depositing a layer of low temperature spin-on-glass on said conductive layer; said spin-on-glass containing dye; and,
   c. any patterning of said conductive layer and heating cycle greater than 200 degrees C. done after said depositing of said low temperature spin on glass, whereby the formation of hillocks and voids in said conductive layer is inhibited, and said spin-on-glass acts as an antireflective coating during patterning.

2. The process defined by claim 1 wherein said conductive layer is aluminum.

3. The process defined by claim 1 wherein said layer of spin on glass is approximately 800–5000 A thick.

4. A process for forming a patterned, alloyed conductive layer on a silicon substrate comprising the steps of:
   depositing a metallic conductive layer over said silicon substrate;
   forming a layer of spin-on glass on said conductive layer, said spin-on glass layer containing dye;
   patterning said conductive layer utilizing photolithographic techniques;
   heating said silicon substrate to a temperature sufficient to alloy said conductive layer and said silicon substrate.

5. The process as defined by claim 4 wherein said conductive layer is aluminum.

6. The process as defined by claim 5 wherein said layer of spin-on glass is approximately 800 to 5000 A thick.

7. The process as defined by claim 6 wherein said silicon substrate is heated to at least approximately 200° centigrade.

* * * * *